(12) United States Patent
Park et al.

(10) Patent No.: US 9,577,000 B2
(45) Date of Patent: Feb. 21, 2017

(54) IMAGE SENSORS INCLUDING PHOTOELECTRIC CONVERSION PORTIONS WITH INCREASED AREA

(71) Applicant: Samsung Electronics Co., Ltd., Suwon-si, Gyeonggi-do (KR)

(72) Inventors: Dukseo Park, Hwaseong-Si (KR); Sangil Jung, Seoul (KR); Changrok Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/956,680

(22) Filed: Dec. 2, 2015

(65) Prior Publication Data

US 2016/0197118 A1    Jul. 7, 2016

(30) Foreign Application Priority Data

Dec. 24, 2014  (KR) .................. 10-2014-0188109

(51) Int. Cl.
  *H01L 27/14*   (2006.01)
  *H01L 27/146*  (2006.01)

(52) U.S. Cl.
  CPC .... *H01L 27/14643* (2013.01); *H01L 27/1461* (2013.01); *H01L 27/1463* (2013.01); *H01L 27/14603* (2013.01); *H01L 27/14607* (2013.01); *H01L 27/14612* (2013.01); *H01L 27/14614* (2013.01); *H01L 27/14689* (2013.01)

(58) Field of Classification Search
  CPC ......... H01L 27/14812; H01L 27/14612; H01L 27/14643
  USPC ..................................................... 257/431–46
  See application file for complete search history.

(56) References Cited

U.S. PATENT DOCUMENTS

| 4,760,273 | A | * | 7/1988 | Kimata ................. H01L 29/768 250/208.1 |
|---|---|---|---|---|
| 6,465,846 | B1 | | 10/2002 | Osanai |
| 6,500,692 | B1 | | 12/2002 | Rhodes |
| 6,787,386 | B2 | | 9/2004 | Park |
| 7,217,968 | B2 | | 5/2007 | Adkisson et al. |
| 7,456,452 | B2 | * | 11/2008 | Wells ................ H01L 27/14601 257/292 |
| 8,487,350 | B2 | | 7/2013 | Nozaki et al. |
| 2008/0121952 | A1 | | 5/2008 | Chu |

FOREIGN PATENT DOCUMENTS

| KR | 1020000086670 | 12/2000 |
|---|---|---|
| KR | 1020050134131 | 12/2005 |
| KR | 1020060117378 | 11/2006 |

* cited by examiner

*Primary Examiner* — Benjamin Sandvik
*Assistant Examiner* — Herve Assouman
(74) *Attorney, Agent, or Firm* — Myers Bigel, P.A.

(57) ABSTRACT

An image sensor can include a photoelectric conversion part of an active region of a substrate and a trench in the substrate. A transfer transistor gate electrode can extend from outside the trench into the trench and terminate in the trench to provide an exposed portion of the trench in the photoelectric conversion part.

16 Claims, 16 Drawing Sheets

3000

4000

IMAGE SENSORS INCLUDING PHOTOELECTRIC CONVERSION PORTIONS WITH INCREASED AREA

CROSS-REFERENCE TO RELATED APPLICATIONS

This U.S. non-provisional patent application claims priority under 35 U.S.C. §119 to Korean Patent Application No. 10-2014-0188109, filed on Dec. 24, 2014, in the Korean Intellectual Property Office, the entire contents of which are hereby incorporated herein by reference.

FIELD

Example embodiments of the inventive concept relate to an image sensor, and in particular, to an image sensor having an active region, in which a trench is formed.

BACKGROUND OF THE INVENTION

Image sensors are semiconductor devices capable of converting optical images into electric signals. The image sensor may be classified into two types: a charge coupled device (CCD) type and a complementary metal-oxide-semiconductor (CMOS) type. The CMOS type image sensor (CIS) may include a plurality of pixels two-dimensionally arranged. Each of the pixels may include a photodiode (PD) that converts incident light into an electrical signal.

As an integration density of the image sensor increases, a size of each pixel in the image sensor decreases, which can lead to a reduction in full well capacity of each photodiode.

SUMMARY

Embodiments according to the inventive concept can provide image sensors including photoelectric conversions portions with increased area. Pursuant to these embodiments, an image sensor may include a semiconductor substrate, a device isolation layer on the semiconductor substrate defining an active region of the semiconductor substrate, the active region including first and second regions spaced apart from each other and a third region between the first and second regions, a trench in the semiconductor substrate extending from the first region to the third region, a photoelectric conversion part provided in the first region and overlapped with the trench, in a plan view of the image sensor, a gate electrode provided in a portion of the trench formed on the third region and exposing a portion of the first region in the trench, and a floating diffusion region provided in the second region.

In some example embodiments, the gate electrode can extend from the trench onto a top surface of the third region adjacent to the trench.

In some example embodiments, the photoelectric conversion part may be extended into the first region adjacent to the trench.

In some example embodiments, the trench may be spaced apart from the second region.

In some example embodiments, the trench may have an inclined sidewall.

In some example embodiments, the image sensor may further include at least one additional trench in the first region overlapped with the photoelectric conversion part.

In some example embodiments, the at least one additional trench may be spaced apart from the trench.

In some example embodiments, the at least one additional trench may be connected to the trench.

In some example embodiments, the at least one additional trench may be extended into the third region.

In some example embodiments, the at least one additional trench may be spaced apart from the second region.

In some example embodiments, the at least one additional trench may be connected to the trench on the third region.

In some example embodiments, the gate electrode may be disposed in the at least one additional trench on the third region and expose a portion of the first region in the at least one additional trench.

In some example embodiments, the photoelectric conversion part may be overlapped with the at least one additional trench, when viewed in the plan view.

In some example embodiments, the photoelectric conversion part may include a first doped region in an upper portion of the active region, and a, second doped region below the first doped region, the second doped region being in contact with the first doped region and having the same conductivity type as that of the floating diffusion region.

In some example embodiments, the second doped region may include a portion that is overlapped with the trench and is spaced farther apart from an uppermost surface of the semiconductor substrate than other portion of the second doped region.

According to example embodiments of the inventive concept, an image sensor may include a semiconductor substrate, a device isolation layer on the semiconductor substrate defining active region of the semiconductor substrate, a trench formed in the active region, the trench including a first portion and a second portion connected to each other, a gate electrode provided on the first portion of the trench and on the active region adjacent to the first portion, the gate electrode exposing the second portion of the trench, a photoelectric conversion part in an exposed portion of the active region positioned at one side of the gate electrode, the photoelectric conversion part including a portion overlapped with the second portion of the trench, when viewed in a plan view of the image sensor, and a floating diffusion region in another exposed portion of the active region positioned at another side of the gate electrode, the floating diffusion region being spaced apart from the photoelectric conversion part.

In some example embodiments, the floating diffusion region may be spaced apart from the trench, when viewed in the plan view.

In some example embodiments, the image sensor may further include at least one additional trench in a portion of the active region positioned at the one side of the gate electrode, and the photoelectric conversion part may be overlapped with the at least one additional trench, when viewed in the plan view.

In some example embodiments, the photoelectric conversion part may include a first doped region formed in an upper portion of the active region, and a second doped region formed below the first doped region, the second doped region being in contact with the first doped region and having the same conductivity type as that of the floating diffusion region.

In some example embodiments, the second doped region may include a portion that is overlapped with the trench and is spaced farther apart from an uppermost surface of the semiconductor substrate than other portion of the second doped region.

In some example embodiments, an image sensor can include a photoelectric conversion part of an active region of a substrate and a trench in the substrate. A transfer transistor gate electrode can extend from outside the trench into the trench and terminate in the trench to provide an exposed portion of the trench in the photoelectric conversion part.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION OF EMBODIMENTS ACCORDING TO THE INVENTION

Figure 1:
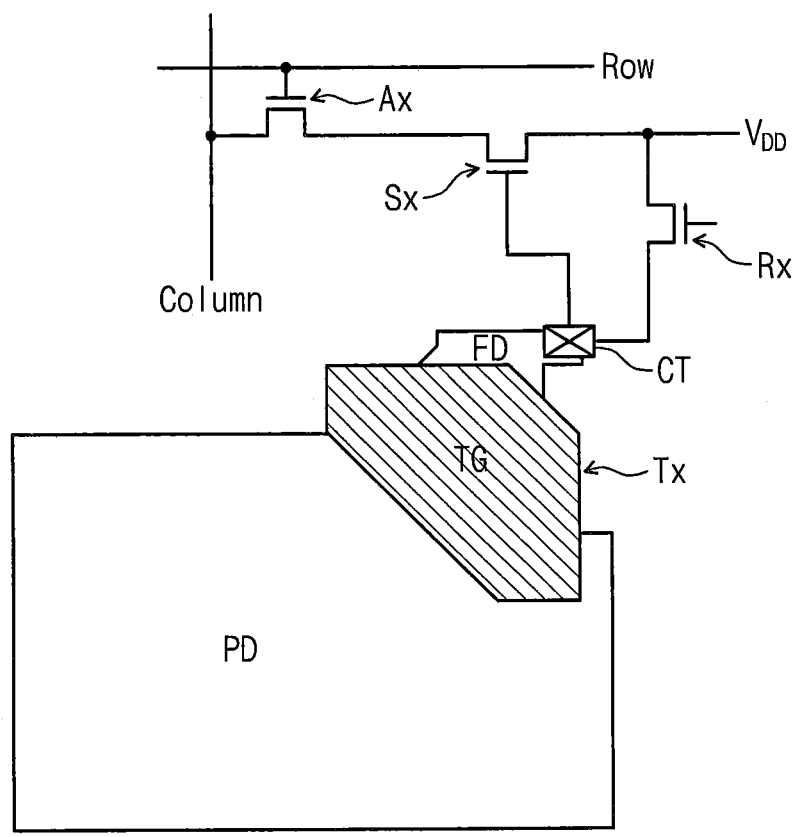
FIG. 1 is a schematic diagram illustrating an interconnection structure between a photoelectric conversion part and a peripheral circuit in an image sensor according to example embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic diagram illustrating an interconnection structure between a photoelectric conversion part and a peripheral circuit in an image sensor according to example embodiments of the inventive concept.

Referring to FIG. 1, an image sensor may include a plurality of unit pixels, which are electrically separated from each other by a device isolation layer, and each of the unit pixels may include a photoelectric conversion part PD and a transfer transistor Tx. In each of the unit pixels, a trench may be formed to extend from the photoelectric conversion part PD to the transfer transistor Tx. A drain region of the transfer transistor Tx may be called a floating diffusion region FD. The floating diffusion region FD may be used as a source region of a reset transistor Rx. Further, a contact CT may be formed on the floating diffusion region FD, and the contact CT may be electrically connected to a selection gate electrode of a selection transistor Sx. The selection transistor Sx may be connected to an access transistor Ax. The reset transistor Rx, the selection transistor Sx, and the access transistor Ax may be shared by at least two pixels disposed adjacent to each other, and this sharing makes it possible to increase an integration density of the image sensor.

Hereinafter, a method of operating the image sensor will be exemplarily described with reference to FIG. 1. In a light-blocking state, a voltage VDD for discharging remaining electric charges from the floating diffusion region may be applied via the reset transistor Rx and the selection transistor Sx. Next, the reset transistor Rx may be turned off, and then, an external light may be incident into the photoelectric conversion part PD which serves as a light-receiving part. Here, electron-hole pairs may be generated in the photoelectric conversion part PD. The holes may be moved into and stored in a doped p-type region while the electrons may be moved into and stored in a doped n-type region. If the transfer transistor Tx is turned on, the electric charges may be delivered to the floating diffusion FD region, and a gate bias of the selection transistor Sx may be changed depending on an amount of the delivered electric charges. This may lead to a change in electric potential of a source region of the selection transistor Sx. At this point, a signal corresponding to the accumulated charges may be read out through a column line by turning on the access transistor Ax.

An increase in integration density of the image sensor can lead to a reduction in size and full well capacity of the photoelectric conversion part PD. However, in the case of the image sensor according to example embodiments of the inventive concept, a trench may be formed to extend from the photoelectric conversion part PD to the transfer transistor Tx. Accordingly, the photoelectric conversion part PD may be formed along bottom and side surfaces of the trench, thereby having an increased area. As a result, the photoelectric conversion part PD can have an increased full well capacity. Further, a portion of a gate electrode of the transfer transistor Tx may be formed in the trench, and this makes it possible to reduce a distance between a channel region of the transfer transistor Tx and the photoelectric conversion part PD. As a result, the image sensor can have reduced image lag.

Figure 2:
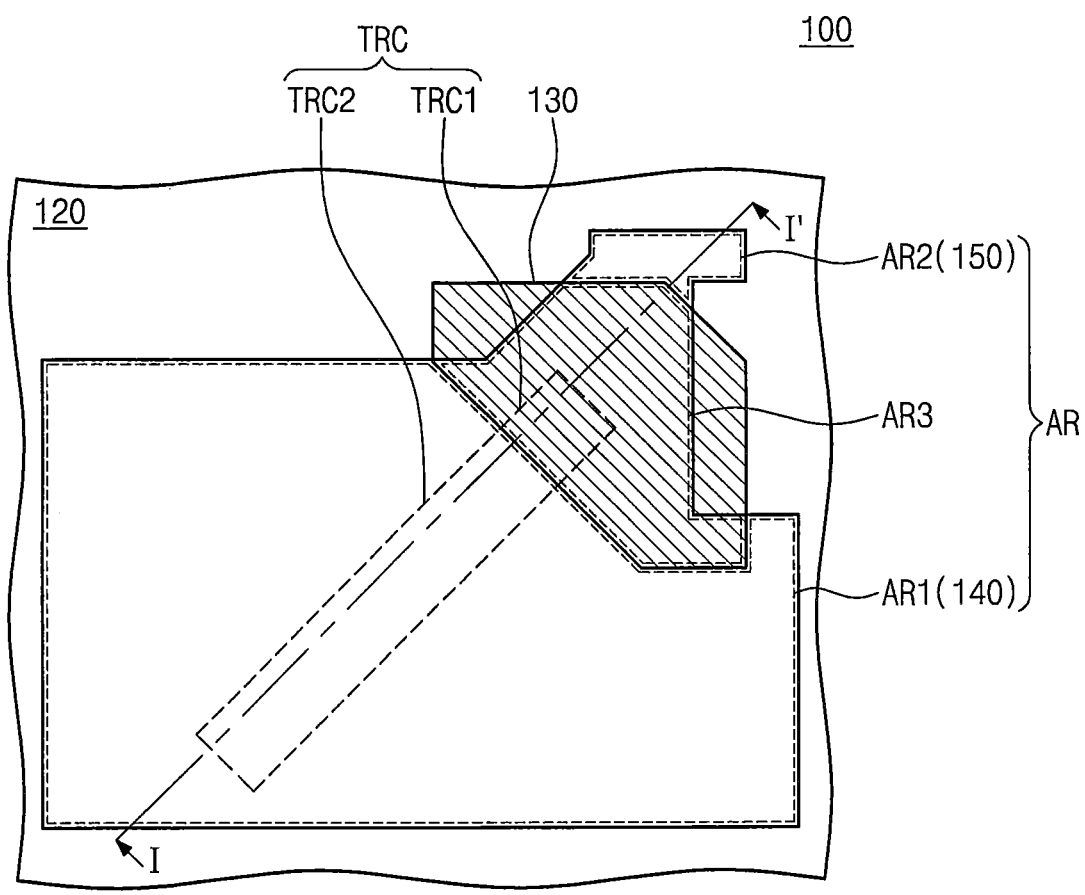
FIG. 2 is a plan view illustrating an image sensor according to embodiments of the inventive concept.
Figure 3:
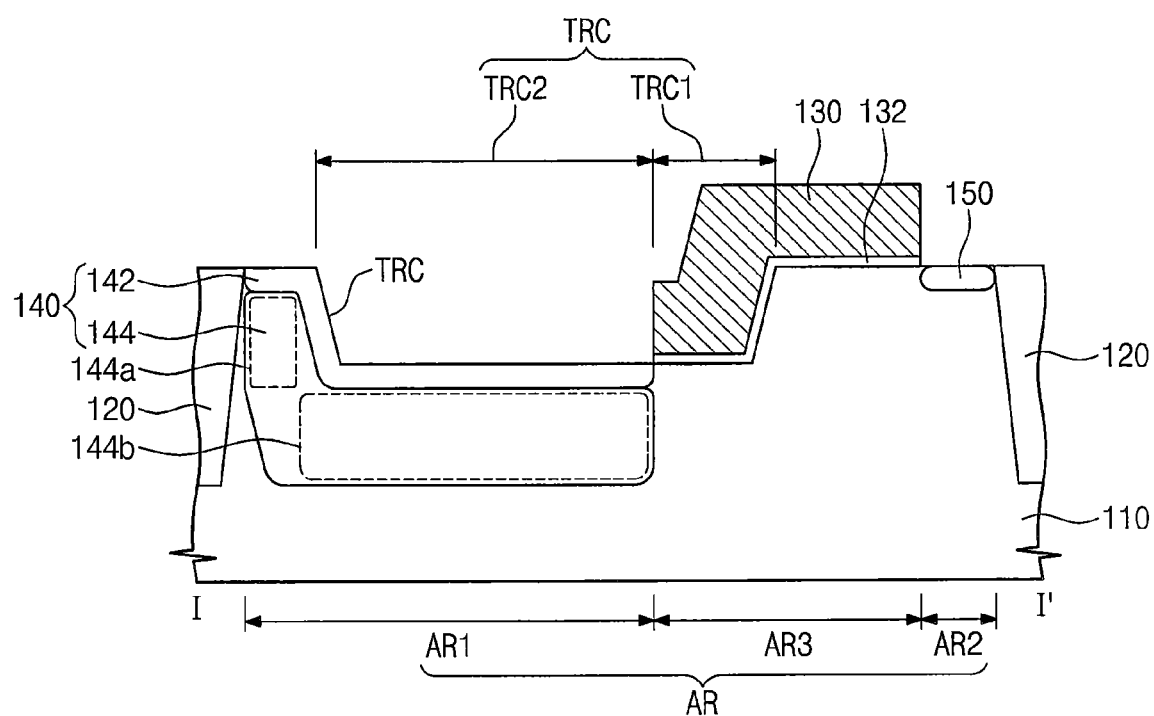
FIG. 3 is a sectional view taken along line I-I' of FIG. 2, 4, 6, or 8 to illustrate image sensors according to example embodiments of the inventive concept.

FIG. 2 is a plan view illustrating an image sensor according to embodiments of the inventive concept. FIG. 3 is a sectional view taken along line I-I' of FIG. 2, 4, 6, or 8 to illustrate image sensors according to example embodiments of the inventive concept.

Referring to FIGS. 2 and 3, an image sensor 100 may include a semiconductor substrate 110, a device isolation layer 120, a gate electrode 130, a photoelectric conversion part 140, and a floating diffusion region 150.

The device isolation layer 120 may be provided on the semiconductor substrate 110 to define an active region AR. The active region AR may include first to third active regions AR1, AR2, and AR3. The first active region AR1 and the second active region AR2 may be spaced apart from each other, and the third active region AR3 may be provided between the first and second active regions AR1 and AR2. For example, when viewed in a plan view, the active region AR may be shaped like a rectangle with a protruding corner, and here, the first active region AR1 may be a rectangular region other than the protruding corner, the second active region AR2 may be the corner region protruding from the first active region AR1, and the third active region AR3 may be a region connecting the first active region AR1 to the second active region AR2. The semiconductor substrate 110 may be doped to have a first conductivity type (e.g., p-type).

The active region AR of the semiconductor substrate 110 may include a top surface having a trench TRC. The trench TRC may extend from the first active region AR1 to the third active region AR3, but not to the second active region AR2. Hereinafter, the trench TRC in the third active region AR3 will be referred to as a first trench portion TRC1, and the trench TRC in the first active region AR1 will be referred to as a second trench portion TRC2. The trench TRC may have a sidewall at angle to a top surface of the semiconductor substrate 110.

The gate electrode 130 may be provided to cover the third active region AR3. The first active region AR1 and the second trench portion TRC2 may be exposed at a side of the gate electrode 130, and the second active region AR2 may be exposed at another side of the gate electrode 130. In other words, the gate electrode 130 may be provided to extend from the first trench portion TRC1 to a top surface of the third active region AR3 adjacent to the first trench portion TRC1. A gate insulating layer 132 may be provided between the gate electrode 130 and the semiconductor substrate 110 to electrically separate the semiconductor substrate 110 from the gate electrode 130. The gate electrode 130 may be used as the gate TG of the transfer transistor Tx described with reference to FIG. 1.

The photoelectric conversion part 140 may be provided in an upper portion of the first active region AR1. For example, in a sectional view, the photoelectric conversion part 140 may have a crooked or undulating shape extending along bottom and side surfaces of the trench TRC. The photoelectric conversion part 140 may include a first doped region 142, which is formed in the upper portion of the first active region AR1, and a second doped region 144, which is formed below and is in contact with the first doped region 142. The first doped region 142 may be doped to have the first conductivity type (e.g., p-type), and the second doped region 144 may be doped to have a second conductivity type (e.g., n-type). Accordingly, the first and second doped regions 142 and 144 may constitute a pn junction and may serve as a photodiode. The first doped region 142 may have an impurity doping concentration higher than that of the second doped region 144.

The photoelectric conversion part 140 may be partially overlapped with the second trench portion TRC2, when viewed in a plan view. Accordingly, the second doped region 144 may be partially overlapped with the second trench portion TRC2, when viewed in a plan view. The second doped region 144 may include a portion 144b which is overlapped with the second trench portion TRC2 when viewed in a plan view, and another portion 144a which is not overlapped with the second trench portion TRC2 when viewed in a plan view. The portion 144b of the second doped region 144 is spaced farther apart from the uppermost surface of the semiconductor substrate 110 than the other portion 144a of the second doped region 144.

The photoelectric conversion part 140 may serve as the photoelectric conversion part PD described with reference to FIG. 1. If light is incident into the photoelectric conversion part 140, electron-hole pairs may be generated in the photoelectric conversion part 140. In this case, the holes and the electrons may be moved into and stored in the first and second doped regions 142 and 144, respectively.

The floating diffusion region 150 may be formed in an upper portion of the second active region AR2. The floating diffusion region 150 may be doped to have the second conductivity type (e.g., n-type) and may have an impurity doping concentration higher than that of the second doped region 144. The trench TRC may not be extended to the second active region AR2, and when viewed in a plan view, the floating diffusion region 150 may not be overlapped with the trench TRC. The floating diffusion region 150 and the photoelectric conversion part 140 may be respectively formed at opposite sides of the gate electrode 130 and may be spaced apart from each other. The floating diffusion region 150 may serve as the floating diffusion region FD described with reference to FIG. 1. When a turn-on voltage is applied to the gate electrode 130, the photoelectric conversion part 140 and the floating diffusion region 150 may be electrically connected to each other through a channel region, which may be formed in an upper portion of the third active region AR3. In this case, electric charges (e.g., electrons or holes) stored in the photoelectric conversion part 140 may be transferred to the floating diffusion region 150.

According to example embodiments of the inventive concept, the image sensor 100 may include the photoelectric conversion part 140, which may be provided in the upper portion of the first active region AR1 and be extended along bottom and side surfaces of the trench TRC in a sectional view. Accordingly, compared with the first active region AR1 without such a trench, the photoelectric conversion part 140 can have an increased area. This makes it possible to increase a full well capacity of the image sensor 100.

Further, according to example embodiments of the inventive concept, the image sensor 100 may include the gate electrode 130, a part of which is formed in the trench TRC. For example, the gate electrode 130 may include a part extended into the trench TRC to be close to a part of the photoelectric conversion part 140 which is formed under the trench TRC. This makes it possible to reduce a distance between a channel region, which may electrically connect the photoelectric conversion part 140 to the floating diffusion region 150, and the photoelectric conversion part 140. As a result, the image sensor 100 can have reduced image lag.

Figure 4:
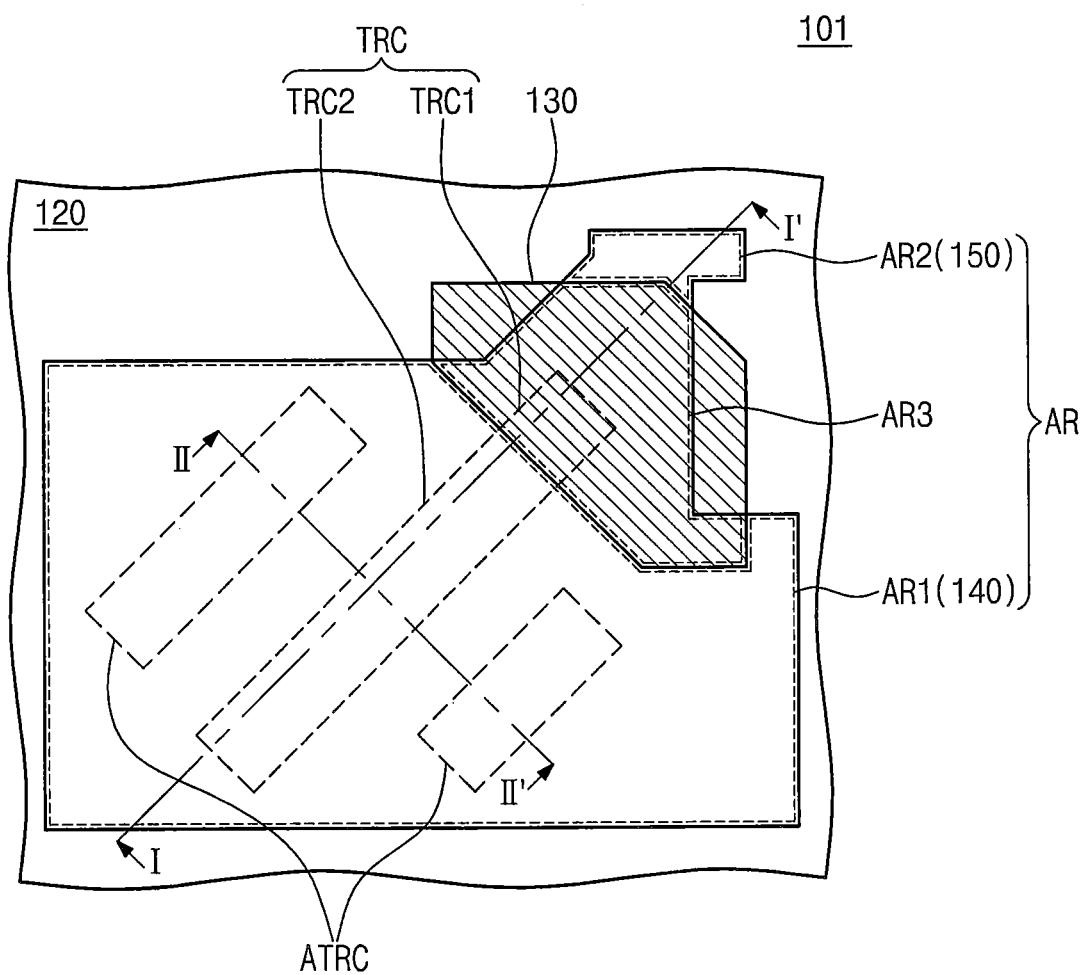
FIG. 4 is a plan view illustrating an image sensor according to embodiments of the inventive concept.
Figure 5:
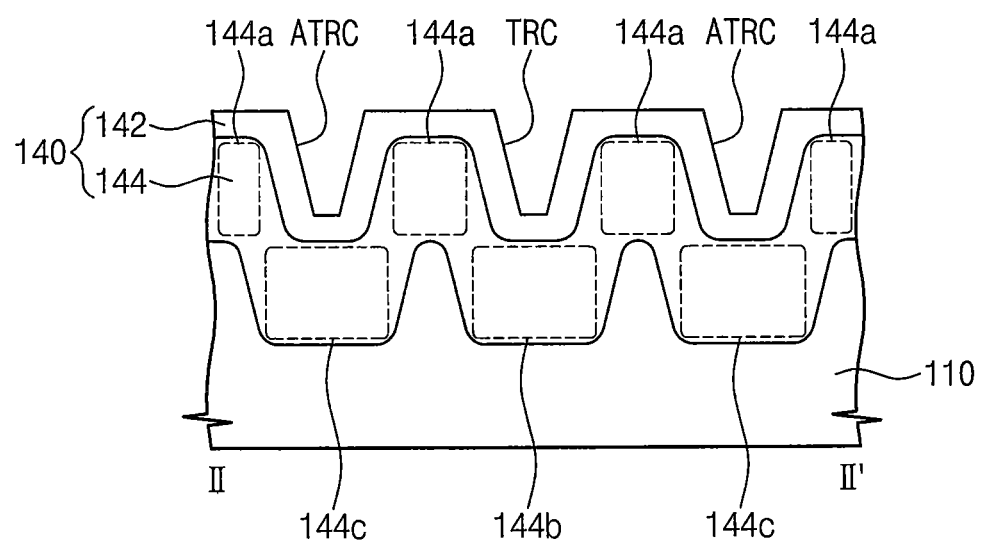
FIG. 5 is a sectional view taken along line of FIG. 4 to illustrate an image sensor according to embodiments of the inventive concept.

FIG. 4 is a plan view illustrating an image sensor according to embodiments of the inventive concept. FIG. 5 is a sectional view taken along line II-IF of FIG. 4 to illustrate an image sensor according to embodiments of the inventive concept.

Referring to FIGS. 3 through 5, an image sensor 101 may include the semiconductor substrate 110, the device isolation layer 120, the gate electrode 130, the photoelectric conversion part 140, and the floating diffusion region 150. For concise description, a previously described element may be identified with a similar or identical reference number, and a duplicating description may not be repeated.

The top surface of the semiconductor substrate 110 may have additional trenches ATRC in addition to the trench TRC. The additional trenches ATRC may be formed in the first active region AR1 and may each be spaced apart from the trench TRC. As an example, the additional trenches ATRC may be formed parallel to the trench TRC. The additional trenches ATRC may have side surfaces at angle to the top surface of the substrate 110.

The photoelectric conversion part 140 may be provided in an upper portion of the first active region AR1. For example, in a sectional view, the photoelectric conversion part 140 may have a crooked or undulating shape extending along bottom and side surfaces of the trench TRC and the additional trenches ATRC. The photoelectric conversion part 140 may include the first doped region 142 and the second doped region 144. The first doped region 142 may be formed in an upper portion of the first active region AR1, and the second doped region 144 may be formed below the first doped region 142 to be in contact with the first doped region 142. The first doped region 142 may be doped to have the first conductivity type (e.g., p-type), and the second doped region 144 may be doped to have the second conductivity type (e.g., n-type). Accordingly, the first and second doped regions 142 and 144 may constitute a pn junction and may serve as a photodiode. The first doped region 142 may have an impurity doping concentration higher than that of the second doped region 144.

When viewed in a plan view, the photoelectric conversion part 140 may be partially overlapped with the trench TRC or the additional trenches ATRC. Accordingly, the second doped region 144 may also be partially overlapped with the trench TRC or the additional trenches ATRC, when viewed in a plan view. The second doped region 144 may include at least one portion 144b overlapped with the trench TRC and/or at least one other portion 144c overlapped with the additional trenches ATRC. The portions 114b and 114c may be spaced farther apart from the uppermost surface of the semiconductor substrate 110 than other portion 144a of the second doped region 144 which is not overlapped with the trench TRC and the additional trenches ATRC when viewed in a plan view. Some part of the portion 144a may be positioned between sidewalls of the trenches TRC and ATRC.

In the image sensor 101, the photoelectric conversion part 140 may be provided in the upper portion of the first active region AR1 and be extended along the bottom and side surfaces of the trench TRC and the additional trenches ATRC. Accordingly, the photoelectric conversion part 140 of the image sensor 101 can have an increased area. This makes it possible to improve the full well capacity property of the image sensor 101.

Figure 6:
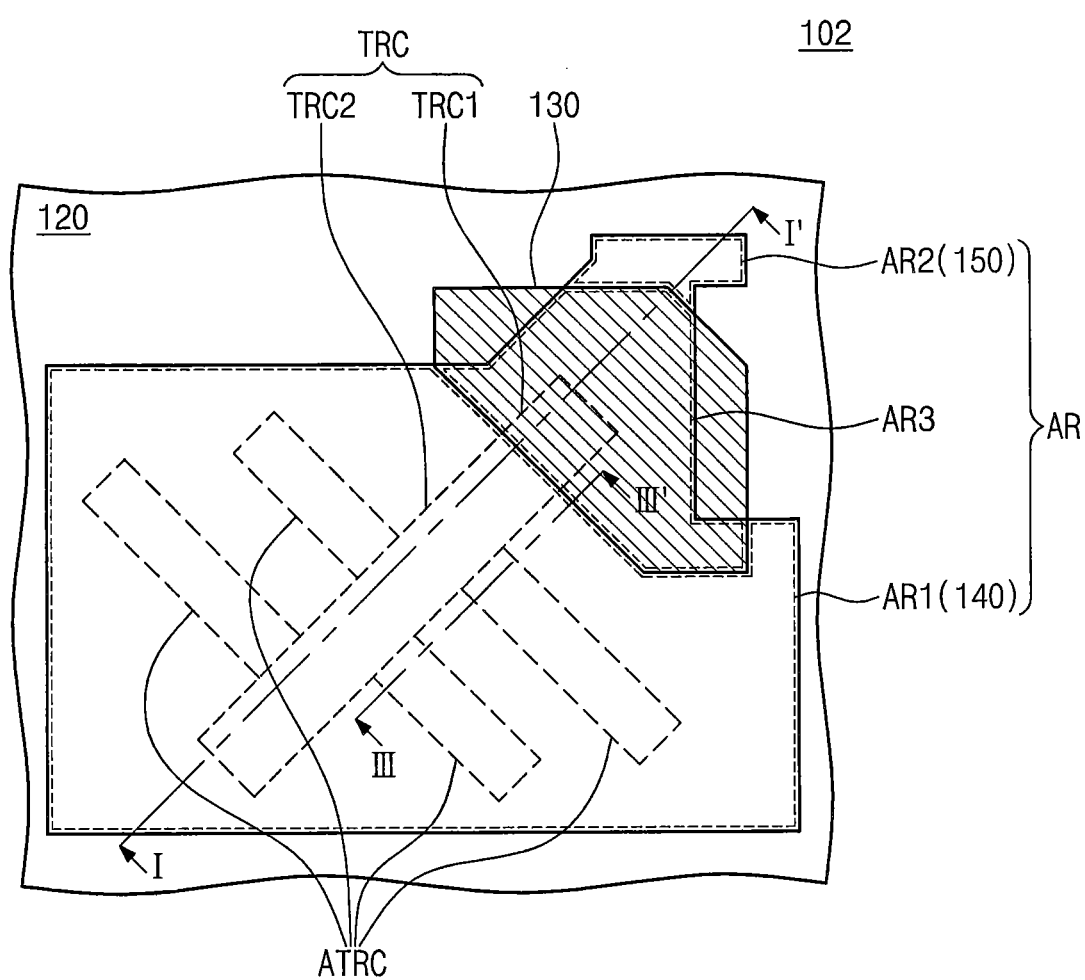
FIG. 6 is a plan view illustrating an image sensor according to embodiments of the inventive concept.
Figure 7:
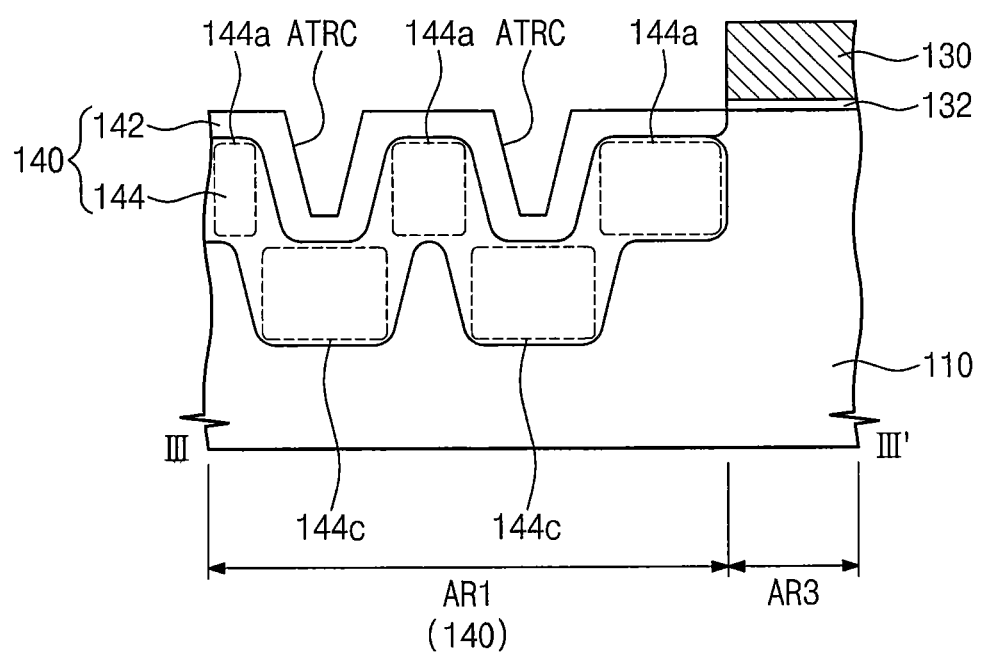
FIG. 7 is a sectional view taken along line of FIG. 6 to illustrate an image sensor according to embodiments of the inventive concept.

FIG. 6 is a plan view illustrating an image sensor according to embodiments of the inventive concept. FIG. 7 is a sectional view taken along line of FIG. 6 to illustrate an image sensor according to embodiments of the inventive concept.

Referring to FIGS. 3, 6, and 7, an image sensor 102 may include the semiconductor substrate 110, the device isolation layer 120, the gate electrode 130, the photoelectric conversion part 140, and the floating diffusion region 150. For concise description, a previously described element may be identified with a similar or identical reference number, and a duplicating description may not be repeated.

The top surface of the semiconductor substrate 110 may have additional trenches ATRC in addition to the trench TRC. The additional trenches ATRC may be formed in the first active region AR1 and may be connected to the trench TRC. As an example, the additional trenches ATRC may be formed to cross the trench TRC or have a longitudinal direction toward the trench TRC. The additional trenches ATRC may have side surfaces at angle to the top surface of the substrate 110.

The photoelectric conversion part 140 may be formed in the upper portion of the first active region AR1. For example, in a sectional view, the photoelectric conversion part 140 may have a crooked or undulating shape extending along bottom and side surfaces of the trench TRC and the additional trenches ATRC. The photoelectric conversion part 140 may include the first doped region 142 and the second doped region 144. The first doped region 142 may be formed in the upper portion of the first active region AR1, and the second doped region 144 may be formed below the first doped region 142 to be in contact with the first doped region 142. The first doped region 142 may be doped to have the first conductivity type (e.g., p-type), while the second doped region 144 may be doped to have the second conductivity type (e.g., n-type). Accordingly, the first and second doped regions 142 and 144 may constitute a pn junction and may serve as a photodiode. The first doped region 142 may have an impurity doping concentration higher than that of the second doped region 144.

When viewed in a plan view, the photoelectric conversion part 140 may be partially overlapped with the trench TRC or the additional trenches ATRC. Accordingly, the second doped region 144 may also be partially overlapped with the trench TRC or the additional trenches ATRC, when viewed in a plan view. The second doped region 144 may include at least one portion 144b overlapped with the trench TRC and/or at least one other portion 144c overlapped with the additional trenches ATRC. The portions 144b and 144c may be spaced farther apart from the uppermost surface of the semiconductor substrate 110 than other portion 144a of the second doped region 144 which is not overlapped with the trench TRC and the additional trenches ATRC when viewed in a plan view.

In the image sensor 102, the photoelectric conversion part 140 may be provided in the upper portion of the first active region AR1 and be extended along the bottom and side surfaces of the trench TRC and the additional trenches ATRC. Accordingly, the photoelectric conversion part 140 of the image sensor 102 can have an increased area. This makes it possible to improve the full well capacity property of the image sensor 102.

Figure 8:
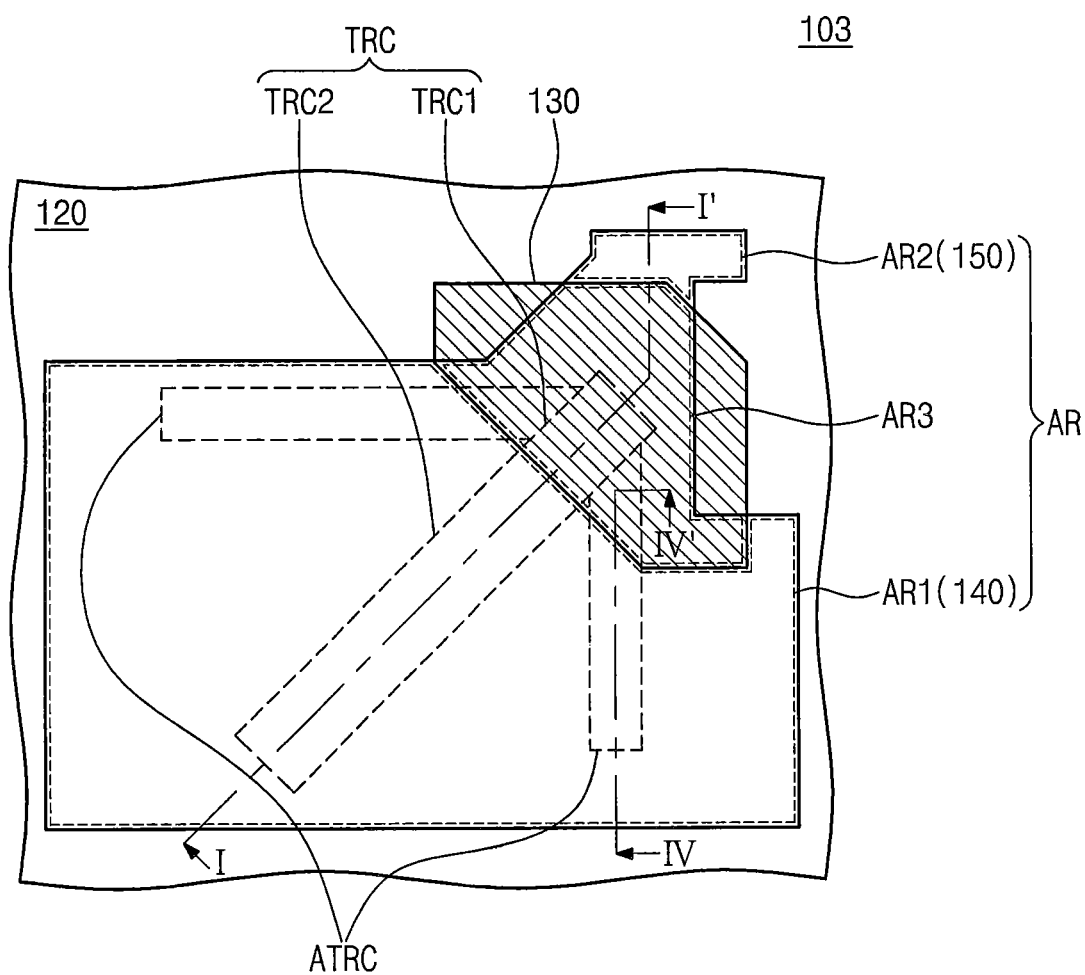
FIG. 8 is a plan view illustrating an image sensor according to embodiments of the inventive concept.
Figure 9:
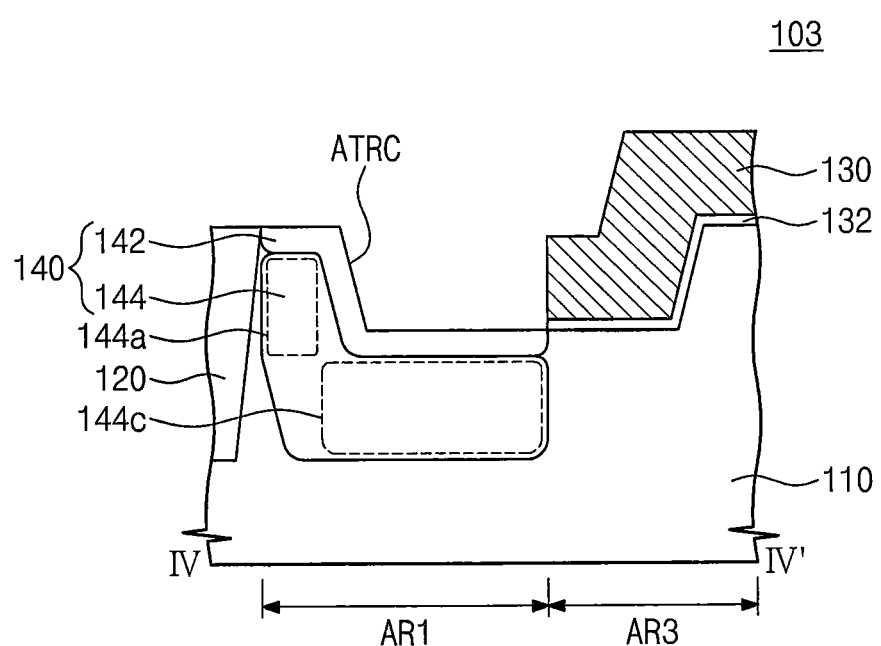
FIG. 9 is a sectional view taken along line IV-IV' of FIG. 8 to illustrate an image sensor according to embodiments of the inventive concept.

FIG. 8 is a plan view illustrating an image sensor according to embodiments of the inventive concept. FIG. 9 is a sectional view taken along line IV-IV' of FIG. 8 to illustrate an image sensor according to embodiments of the inventive concept.

Referring to FIGS. 3, 8, and 9, an image sensor 103 may include the semiconductor substrate 110, the device isolation layer 120, the gate electrode 130, the photoelectric conversion part 140, and the floating diffusion region 150. For concise description, a previously described element may be identified with a similar or identical reference number, and a duplicating description will not be repeated.

The top surface of the semiconductor substrate 110 may have additional trenches ATRC in addition to the trench TRC. The additional trenches ATRC may extend from the first active region AR1 to the third active region AR3, but not to the second active region AR2. The additional trenches ATRC may be connected to the trench TRC. As an example, the additional trenches ATRC may be connected to the trench TRC in the third active region AR3. The additional trenches ATRC may have side surfaces at angle to the top surface of the substrate 110.

The gate electrode 130 may be provided to cover the third active region AR3. The first active region AR1 may be exposed at a side of the gate electrode 130, and the second active region AR2 may be exposed at another side of the gate electrode 130. In other words, the gate electrode 130 may be provided to extend from the first trench portion TRC1 to a top surface of the third active region AR3 adjacent to the first trench portion TRC1 and from the additional trenches ATRC in the third active region AR3 to a top surface of the third active region AR3 adjacent to the additional trenches ATRC. The gate insulating layer 132 may be provided between the gate electrode 130 and the semiconductor substrate 110 to electrically separate the semiconductor substrate 110 from the gate electrode 130. The gate electrode 130 may be used as the gate Tg of the transfer transistor Tx described with reference to FIG. 1.

The photoelectric conversion part 140 may be formed in an upper portion of the first active region AR1. For example, in a sectional view, the photoelectric conversion part 140 may have a crooked or undulating shape extending along bottom and side surfaces of the trench TRC and the additional trenches ATRC. The photoelectric conversion part 140 may include the first doped region 142 and the second doped region 144. The first doped region 142 may be formed in the upper portion of the first active region AR1, and the second doped region 144 may be formed below the first doped region 142 to be in contact with the first doped region 142. The first doped region 142 may be doped to have the first conductivity type (e.g., p-type), and the second doped region 144 may be doped to have the second conductivity type (e.g., n-type). Accordingly, the first and second doped regions 142 and 144 may constitute a pn junction and may serve as a photodiode. The first doped region 142 may have an impurity doping concentration higher than that of the second doped region 144.

When viewed in a plan view, the photoelectric conversion part 140 may be partially overlapped with the trench TRC or the additional trenches ATRC. Accordingly, the second doped region 144 may also be partially overlapped with the trench TRC or the additional trenches ATRC, when viewed in a plan view. The second doped region 144 may include at least one portion 144b overlapped with the trench TRC and/or at least one other portion 144c overlapped with the additional trenches ATRC when viewed in a plan view. The portions 144b and 144c may be spaced farther apart from the uppermost surface of the semiconductor substrate 110 than other portion 144a of the second doped region 144 which is not overlapped with the trench TRC and the additional trenches ATRC when viewed in a plan view.

In the image sensor 103, the photoelectric conversion part 140 may be provided in the upper portion of the first active region AR1 and be extended along the bottom and side surfaces of the trench TRC and the additional trenches ATRC. Accordingly, the photoelectric conversion part 140 of the image sensor 103 can have an increased area. This makes it possible to improve the full well capacity property of the image sensor 103.

Further, according to example embodiments of the inventive concept, the image sensor 103 may include the gate electrode 130, a part of which is formed in the additional trenches ATRC. For example, the gate electrode 130 may include a part extended into the trench TRC to be close to a part of the photoelectric conversion part 140 which is formed under the trench TRC. This makes it possible to reduce a distance between a channel region, which may electrically connect the photoelectric conversion part 140 to the floating diffusion region 150, and the photoelectric conversion part 140. As a result, the image sensor 103 can have reduced image lag.

FIGS. 10A through 10D are sectional views corresponding to line I-I' of FIG. 2 and illustrating a method of fabricating an image sensor according to example embodiments of the inventive concept. For concise description, a previously described element may be identified with a similar or identical reference number, and a duplicating description may not be repeated.

Figure 10A:
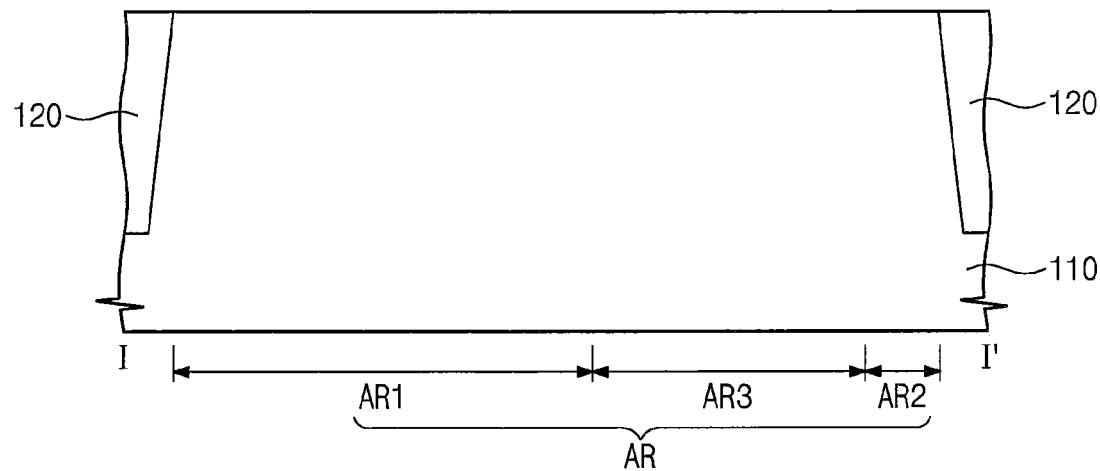
FIGS. 10A through 10D are sectional views corresponding to line I-I' of FIG. 2 and illustrating a method of fabricating an image sensor according to example embodiments of the inventive concept.

Referring to FIG. 10A, the device isolation layer 120 may be formed on the semiconductor substrate 110 to define the active region AR. The active region AR may include, for example, the first to third active regions AR1, AR2, and AR3. The first and second active regions AR1 and AR2 may be spaced apart from each other, and the third active region AR3 may be between the first and second active regions AR1 and AR2. For example, when viewed in a plan view, the active region AR may be shaped like a rectangle with a protruding corner, and here, the first active region AR1 may be a rectangular region other than the protruding corner, the second active region AR2 may be the corner region protruding from the first active region AR1, and the third active region AR3 may be a region connecting the first active region AR1 to the second active region AR2, as shown in FIG. 2. The semiconductor substrate 110 may be doped to have the first conductivity type (e.g., p-type).

Figure 10B:
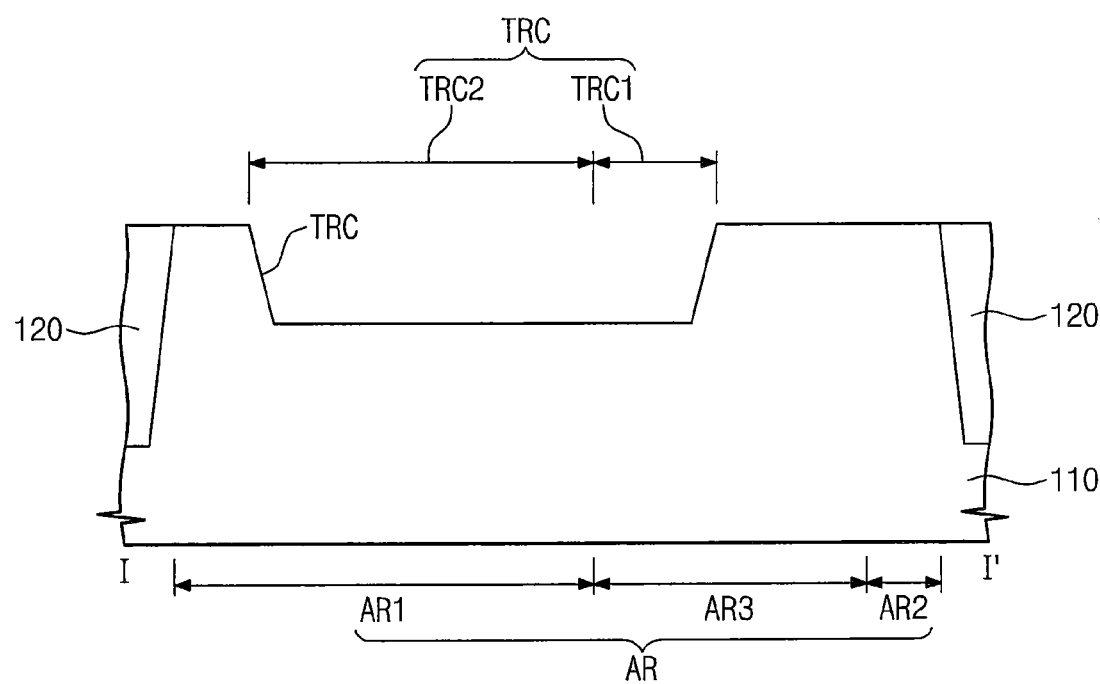

Referring to FIG. 10B, the trench TRC may be formed on the top surface of the active region AR. The trench TRC may be formed by anisotropically etching a portion of the semiconductor substrate 110. The trench TRC may be formed to extend from the first active region AR1 to the third active region AR3, but not to the second active region AR2. The trench TRC in the third active region AR3 will be referred to as a first trench portion TRC1, and the trench TRC in the first active region AR1 will be referred to as a second trench portion TRC2. The trench TRC may be formed to have a sidewall at angle to a top surface of the semiconductor substrate 110.

Additional trenches ATRC, which are described with reference to FIGS. 4, 6 and 8, may be formed near the trench TRC, during the formation of the trench TRC.

Figure 10C:
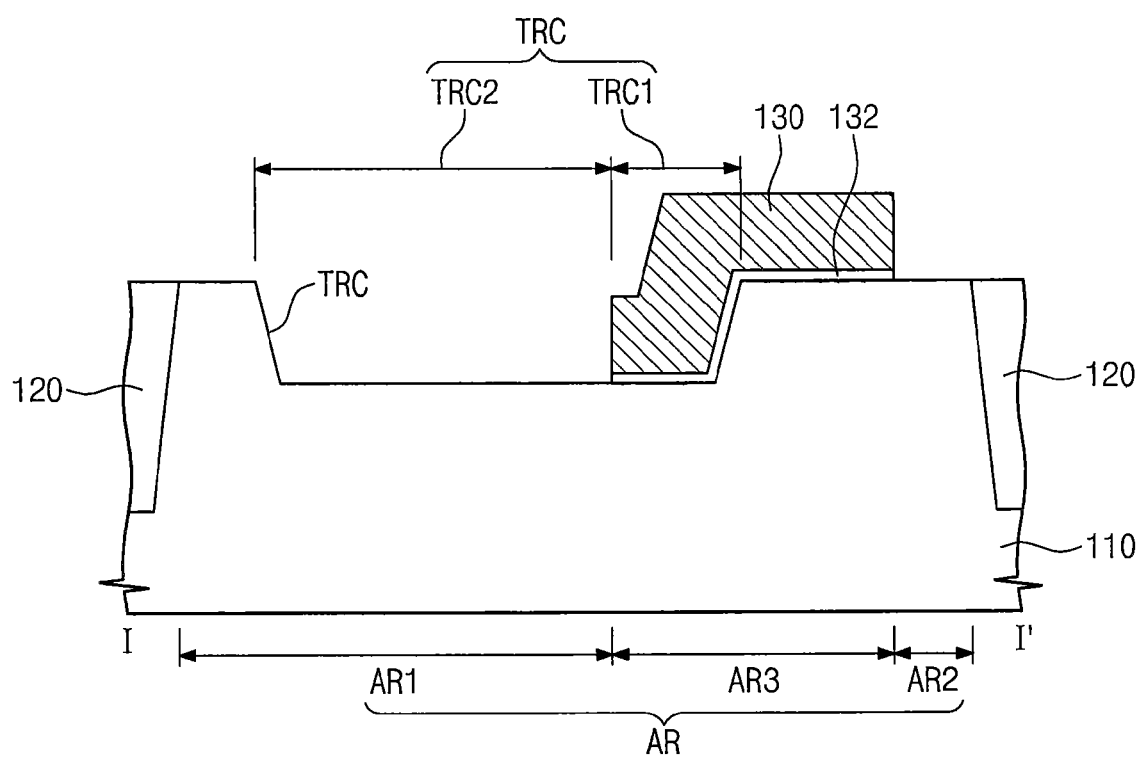

Referring to FIG. 10C, the gate insulating layer 132 and the gate electrode 130 may be sequentially formed on the third active region AR3. The gate insulating layer 132 may be formed to conformally cover the top surface of the third active region AR3 provided with the trench TRC. For example, the gate insulating layer 132 may be formed to conformally cover the first trench portion TRC1. In some embodiments, the additional trenches ATRC may be formed on the third active region AR3, and in this case, the gate insulating layer 132 may be formed to conformally cover bottoms and side surfaces of the additional trenches ATRC. The gate electrode 130 may be formed on the gate insulating layer 132. The first active region AR1 may be exposed at a side of the gate electrode 130, and the second active region AR2 may be exposed at other side of the gate electrode 130.

Figure 10D:
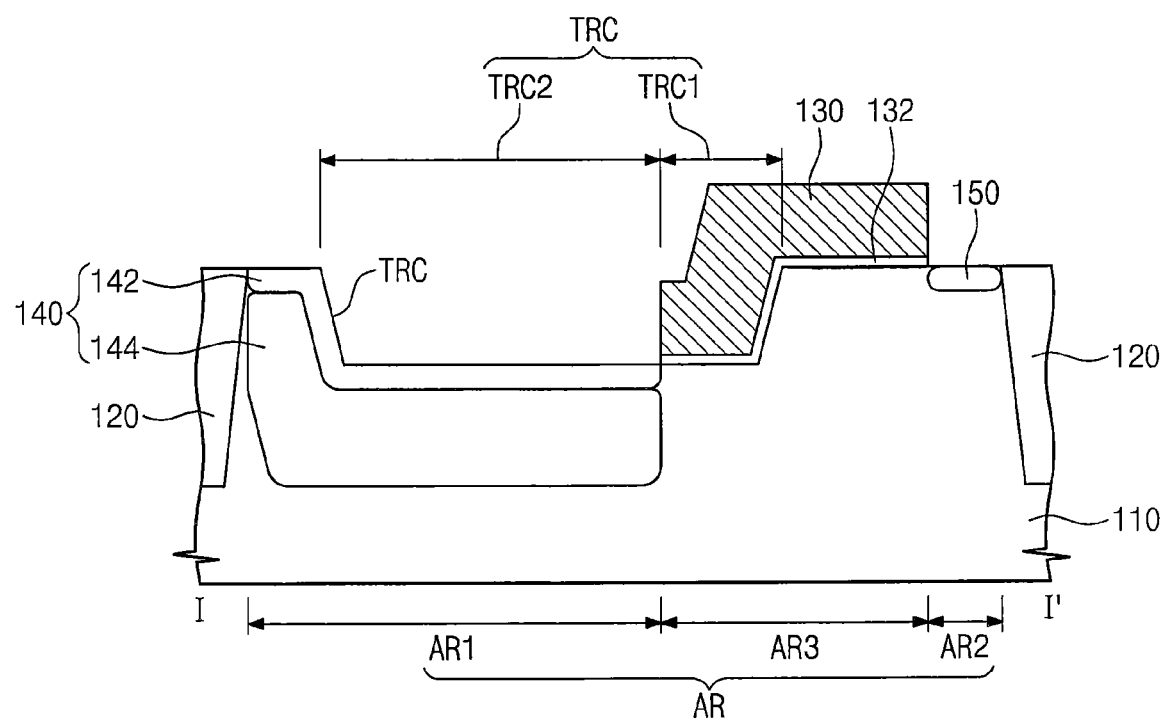

Referring to FIG. 10D, the photoelectric conversion part 140 and the floating diffusion region 150 may be formed.

The photoelectric conversion part 140 may include the first doped region 142 and the second doped region 144. The first doped region 142 may be formed by injecting impurities of the first conductivity type (e.g., p-type) into the first active region AR1, and the second doped region 144 may be formed by injecting impurities of the second conductivity type (e.g., n-type) into the first active region AR1. The injection of the impurities may be performed using an ion implantation process. Depths and doping concentrations of the first and second doped regions 142 and 144 may be controlled by adjusting energy and dose of the impurities. For example, if the energy of the impurities is increased, the doped regions 142 and 144 may be formed at a higher depth, and if the dose of the impurities is increased, the doped regions 142 and 144 may have a higher doping concentration. When compared to the ion implantation process for forming the second doped region 144, the ion implantation process for forming the first doped region 142 may be performed with impurities of lower energy and higher dose. Accordingly, the first doped region 142 may be formed in an upper portion of the first active region AR1, and the second doped region 144 may be formed below the first doped region 142. Further, the first doped region 142 may have a higher doping concentration than that of the second doped region 144.

The floating diffusion region 150 may be formed in an upper portion of the second active region AR2 using, for example, an ion implantation process. The floating diffusion region 150 may be doped to have the second conductivity type (e.g., n-type) and may have an impurity doping concentration higher than that of the second doped region 144.

Figure 11:
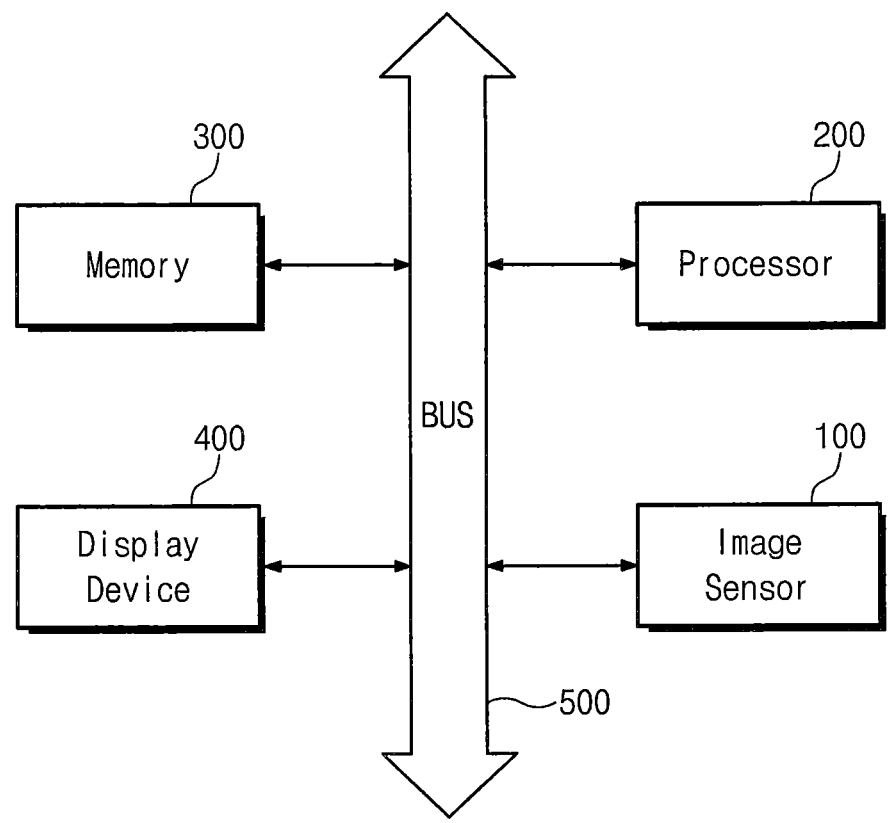
FIG. 11 is a block diagram illustrating an example of electronic devices including an image sensor according to example embodiments of the inventive concept.
Figure 12:
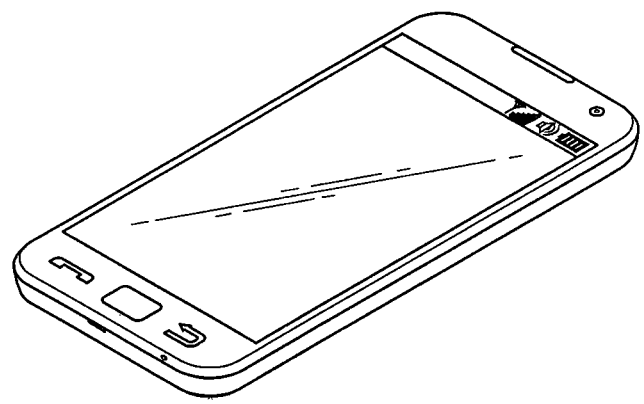
FIGS. 12 through 16 show examples of multimedia devices, to which image sensors according to example embodiments of the inventive concept can be applied.
Figure 13:
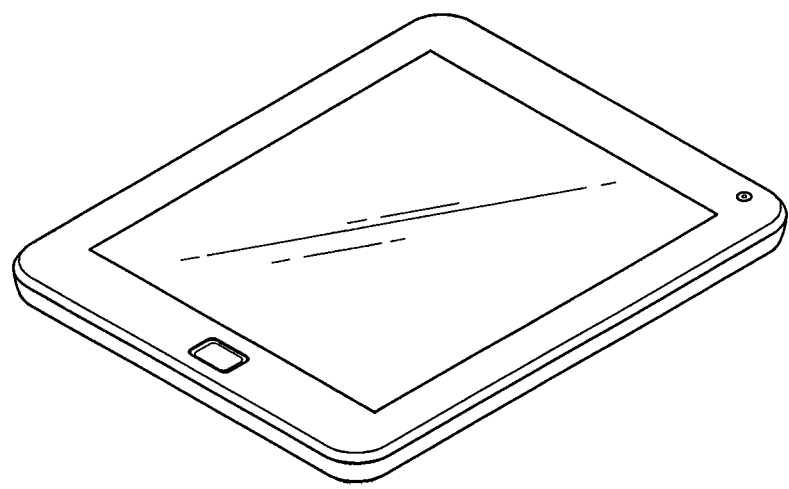
Figure 14:
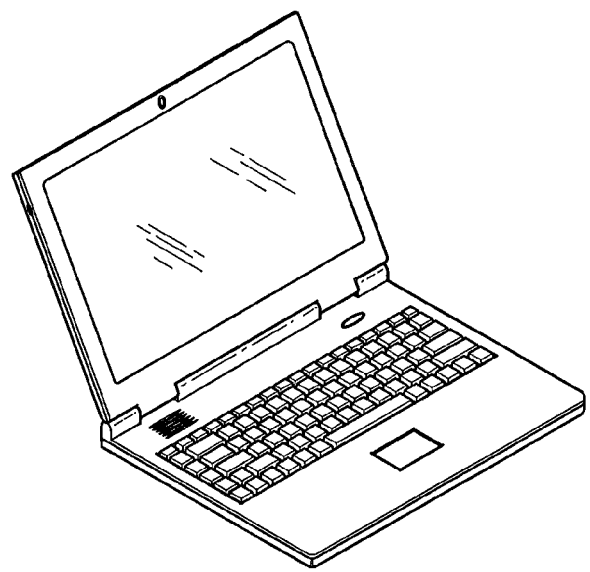
Figure 15:
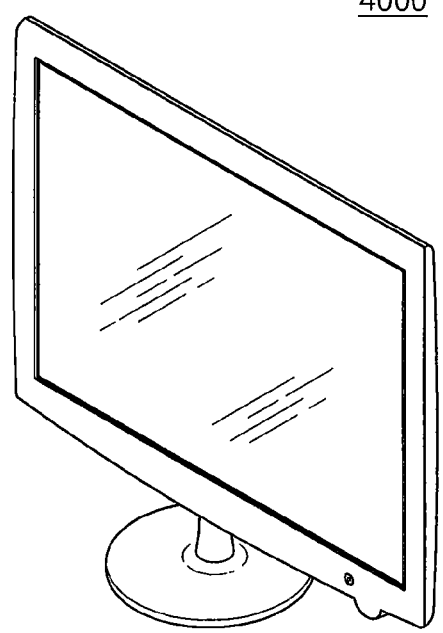
Figure 16:
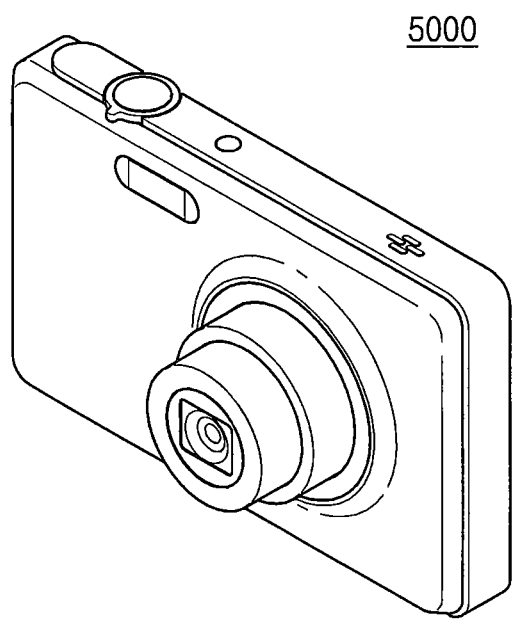

FIG. 11 is a block diagram illustrating an example of electronic devices including an image sensor, according to example embodiments of the inventive concept.

The electronic device may be any of various types of devices, such as a digital camera or a mobile device. Referring to FIG. 11, a digital camera system may include an image sensor 100, a processor 200, a memory 300, a display 400, and a bus 500. The image sensor 100 may capture external image information in response to control of the processor 200. The processor 200 may transmit the captured image data to the memory 300 through the bus 500 and store the captured image data in the memory 300. The processor 200 may also output the image data stored in the memory 300 through the display 400.

FIGS. 12 through 16 show examples of multimedia devices, to which image sensors according to example embodiments of the inventive concept can be applied.

Image sensors according to example embodiments of the inventive concept can be applied to a variety of multimedia devices with an imaging function. For example, image sensors according to example embodiments of the inventive concept may be applied to a mobile phone or a smart phone 1000 as exemplarily shown in FIG. 12, to a tablet PC or a smart tablet PC 2000 as exemplarily shown in FIG. 13, to a laptop computer 3000 as exemplarily shown in FIG. 14, to a television set or a smart television set 4000 as exemplarily shown in FIG. 15, and to a digital camera or a digital camcorder 5000 as exemplarily shown in FIG. 16.

According to example embodiments of the inventive concept, an image sensor may be configured to include a photoelectric conversion part with increased area. Accordingly, the image sensor can have an increased full well capacity.

Further, the image sensor may be configured to have a gate electrode partially formed in a trench. This makes it possible to reduce a distance between a channel, which is formed to electrically connect the photoelectric conversion part to a floating diffusion region, and the floating diffusion region, and consequently to reduce image lag of the image sensor.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
   a semiconductor substrate;
   a device isolation layer on the semiconductor substrate defining an active region of the semiconductor substrate, the active region comprising first and second regions spaced apart from each other and a third region between the first and second regions;
   a trench in the semiconductor substrate extending from the first region to the third region;
   a photoelectric conversion part provided in the first region and overlapped with the trench, in a plan view of the image sensor;
   a gate electrode provided in a portion of the trench on the third region, the gate electrode exposing a portion of the first region in the trench
   a floating diffusion region provided in the second region; and
   at least one additional trench in the first region,
   wherein the at least one additional trench is overlapped with the photoelectric conversion part in the plan view, and
   wherein the trench extends in a first direction and the at least one additional trench extends in a second direction not parallel to the trench.

2. The image sensor of claim 1, wherein the gate electrode extends from the trench onto a top surface of the third region adjacent to the trench.

3. The image sensor of claim 1, wherein the photoelectric conversion part extends into the first region adjacent to the trench.

4. The image sensor of claim 1, wherein the trench is spaced apart from the second region.

5. The image sensor of claim 1, wherein the at least one additional trench extends into the third region.

6. The image sensor of claim 5, wherein the gate electrode is disposed in the at least one additional trench on the third region and exposes a portion of the first region in the at least one additional trench.

7. The image sensor of claim 1, wherein the photoelectric conversion part is overlapped with the at least one additional trench, when viewed in the plan view.

8. The image sensor of claim 1, wherein the photoelectric conversion part comprises:
   a first doped region in an upper portion of the active region; and
   a second doped region below the first doped region, the second doped region being in contact with the first doped region and having the same conductivity type as that of the floating diffusion region.

9. The image sensor of claim 8, wherein the second doped region comprises a portion that is overlapped with the trench and is spaced farther apart from an uppermost surface of the semiconductor substrate than other portion of the second doped region.

10. An image sensor, comprising:
    a semiconductor substrate;
    a device isolation layer on the semiconductor substrate defining an active region of the semiconductor substrate;
    a trench in the active region, the trench comprising a first portion and a second portion connected to each other;
    a gate electrode provided on the first portion of the trench and on the active region adjacent to the first portion, the gate electrode exposing the second portion of the trench;
    a photoelectric conversion part in an exposed portion of the active region positioned at one side of the gate electrode, the photoelectric conversion part comprising a portion overlapped with the second portion of the trench, when viewed in a plan view of the image sensor;
    a floating diffusion region in another exposed portion of the active region positioned at another side of the gate electrode, the floating diffusion region being spaced apart from the photoelectric conversion part, and
    at least one additional trench in a portion of the active region positioned at the one side of the gate electrode;
    wherein the photoelectric conversion part is overlapped with the at least one additional trench, when viewed in the plan view, and,
    wherein the trench extends in a first direction and the at least one additional trench extends in a second direction not parallel to the trench.

11. The image sensor of claim 10, wherein the floating diffusion region is spaced apart from the trench, when viewed in the plan view.

12. The image sensor of claim 10, wherein the photoelectric conversion part comprises:

a first doped region in an upper portion of the active region; and a second doped region below the first doped region, the second doped region being in contact with the first doped region and having the same conductivity type as that of the floating diffusion region.

13. The image sensor of claim 12, wherein the second doped region comprises a portion that is overlapped with the trench and is spaced farther apart from an uppermost surface of the semiconductor substrate than other portion of the second doped region.

14. An image sensor, comprising:
a photoelectric conversion part of an active region of a substrate;
a first trench in the substrate;
a transfer transistor gate electrode that extends from outside the first trench into the first trench and terminates in the first trench to provide an exposed portion of the first trench in the photoelectric conversion part; and at least one second trench at least partially in the photoelectric conversion part,
wherein the transfer transistor gate electrode extends from outside the second trench to inside the second trench and terminates inside the second trench to provide an exposed portion of the second trench in the photoelectric conversion part; and
wherein the first trench extends in a first direction and the second trench extends in a second direction not parallel to the first trench.

15. The image sensor of claim 14 wherein the trench comprises:
a first side wall on which the gate electrode extends conformally; and
a second side wall that is opposite to the first side wall, the second side wall is in the exposed portion of the trench.

16. The image sensor of claim 14 wherein the gate electrode terminates outside the at least one second trench to provide a separation between the gate electrode and the at least one second trench.

* * * * *